(12) United States Patent
Lee et al.

(10) Patent No.: US 12,063,797 B2
(45) Date of Patent: Aug. 13, 2024

(54) BURIED CONNECTION LINE FOR PERIPHERAL AREA OF A MEMORY DEVICE

(71) Applicant: Micron Technology, Inc., Boise, ID (US)

(72) Inventors: Kyuseok Lee, Boise, ID (US); Sangmin Hwang, Boise, ID (US); Byung Yoon Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 17/513,489

(22) Filed: Oct. 28, 2021

(65) Prior Publication Data

US 2023/0135653 A1    May 4, 2023

(51) Int. Cl.
| | |
|---|---|
| *H10B 99/00* | (2023.01) |
| *H01L 21/321* | (2006.01) |
| *H01L 21/768* | (2006.01) |
| *H01L 21/8238* | (2006.01) |
| *H01L 23/528* | (2006.01) |
| *H01L 23/535* | (2006.01) |
| *H01L 27/092* | (2006.01) |

(52) U.S. Cl.
CPC ......... *H10B 99/00* (2023.02); *H01L 21/3212* (2013.01); *H01L 21/7684* (2013.01); *H01L 21/76895* (2013.01); *H01L 21/823871* (2013.01); *H01L 23/5286* (2013.01); *H01L 23/535* (2013.01); *H01L 27/092* (2013.01)

(58) Field of Classification Search
CPC ..... H10B 99/00; H10B 12/50; H01L 21/3212; H01L 21/7684; H01L 21/76895; H01L 21/823871; H01L 23/5286; H01L 23/535; H01L 27/092; H01L 27/0207
USPC .......................................................... 257/369
See application file for complete search history.

(56) References Cited

U.S. PATENT DOCUMENTS

| | | | | |
|---|---|---|---|---|
| 5,578,860 | A * | 11/1996 | Costa | H01L 27/0617 257/E29.054 |
| 6,258,692 | B1 * | 7/2001 | Chu | H01L 21/76229 257/E21.548 |
| 2006/0244095 | A1 * | 11/2006 | Barry | H10B 41/40 257/E21.549 |

(Continued)

FOREIGN PATENT DOCUMENTS

JP        2000340748    * 12/2000

*Primary Examiner* — Duy T Nguyen
(74) *Attorney, Agent, or Firm* — Perkins Coie LLP

(57) ABSTRACT

An apparatus includes a substrate and a memory cell array disposed on the substrate. The apparatus also includes a logic cell disposed on the substrate in a peripheral region adjacent the memory cell array. The apparatus further includes a trench isolation region disposed in the substrate in the peripheral region. The trench isolation region either separates a first active area of the logic cell from a second active area of the logic cell or separates the logic cell from an adjacent logic cell. The logic cell includes a connection line that is buried within the trench isolation region. The connection line can be formed as an extension of a buried word line in the memory cell array region during a same fabrication process that forms the corresponding buried word line. By extending the buried word line into the peripheral region, the buried connection line can be formed without additional processing.

20 Claims, 8 Drawing Sheets

(56) References Cited

U.S. PATENT DOCUMENTS

| | | | |
|---|---|---|---|
| 2015/0041857 A1* | 2/2015 | Lin | H01L 27/092 |
| | | | 257/192 |
| 2019/0081102 A1* | 3/2019 | Park | G11C 11/161 |
| 2021/0098338 A1* | 4/2021 | Liaw | H01L 27/092 |
| 2021/0225830 A1* | 7/2021 | Liu | H01L 27/0207 |
| 2022/0077147 A1* | 3/2022 | Shih | H01L 23/5286 |

* cited by examiner

BURIED CONNECTION LINE FOR PERIPHERAL AREA OF A MEMORY DEVICE

TECHNICAL FIELD

The present disclosure generally relates to memory devices and more particularly to memory devices in which the peripheral area of the memory device includes at least one connection line that is buried.

BACKGROUND

A memory device can include a semiconductor substrate with one or more memory cell arrays and supporting logic circuits located on the peripheral area (also referred to herein as "peripheral region") adjacent the memory cell arrays. The logic circuits can include, for example, control and addressing circuits, line driver circuits, sense amplifier circuits, and other supporting circuitry for operating and communicating with the memory cell arrays. The peripheral regions can also be used to separate the memory cell arrays from each other. Designing of the peripheral logic circuits is typically done automatically using programs having automatic place and route tools. In addition, to facilitate the automated design process, peripheral logic circuits can be comprised of standardized integrated circuits (also referred to herein as "standard cells") that provide or can be interconnected to provide basic logic functions (AND, OR, XOR, XNOR, inverter, flipflop, latch, etc.).

One or more connection lines (e.g., signal and/or power connection lines) can be disposed above the transistors and routed along predetermined tracks that facilitate intra-cell and inter-cell connections for the standard cells. The predetermined tracks for routing in each standardized cell can be in a grid pattern with rows and columns that are then used by the automatic place and route tools for routing the connection lines. Accordingly, the greater the number of predetermined tracks in each standard cell, the more routing options that are available for the automatic place and route tools, which relaxes the congestion routing, for example, metal channel layers. However, because there are minimum pitch requirements for the row and column connection lines for a given semiconductor technology, increasing the number of tracks means increasing the cell area (assuming the tracks are at the minimum row pitch or the minimum column pitch). Conversely, if the memory cell array area is decreased in order to, for example, decrease the size of the memory device, the standard cell size (e.g., cell height and/or cell width) will also have to be decreased. In conventional memory devices, if the standard cell height is decreased, the number of predetermined tracks in the row direction for routing will also have to be reduced, assuming the row tracks are at the minimum row pitch. Similarly, if the standard cell width is decreased, the number of predetermined tracks in the column direction for routing will also have to be reduced, assuming the column tracks are at the minimum column pitch. Accordingly, to maintain or increase the array efficiency of the memory device while reducing memory cell array size, it would be beneficial to decrease the size of the logic cells without reducing the number of tracks for routing. "Array efficiency" can be defined as the percentage of the semiconductor substrate area of the memory device that includes the memory cell arrays. In addition, it would be beneficial to increase the number of predetermined tracks for routing in a logic cell while maintaining or decreasing the cell height and/or cell width.

For the reasons stated above, and for other reasons stated below which will become apparent to those skilled in the art upon reading and understanding the present specification, there is a need in the art for decreasing the size of the logic cell without reducing the number of routes and/or increasing the number of routes without increasing the logic cell size.

DETAILED DESCRIPTION

Apparatuses in accordance with embodiments of the present disclosure can include memory storage devices and associated control circuits. The memory storage device can have memory regions (e.g., NAND memory regions), logic gates, timers, counters, latches, shift registers, microcontrollers, microprocessors, field programmable gate arrays (FPGAs), sensors, and/or other integrated circuitry. The apparatuses can also include other circuit components, such as multiplexers, decoders, buffers, read/write drivers, address registers, data out/data in registers, etc., for accessing and/or processing data and other functionality, such as, for example, programming memory cells of a memory region and/or communicating with controllers and/or host devices. The memory device can include dynamic random access memory (DRAM) (including, e.g., DDR3, DDR4, DDR5), 3-D memory including high bandwidth memory (HBM) (having, e.g., DRAM, NOR, PCM, RRAM, MRAM), read only memory (ROM); erasable programmable ROM (EPROM); electrically erasable programmable ROM (EEPROM); ferroelectric and other storage media, including volatile storage media.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments. "Logic cell" as used herein is one or more interconnected transistors that provide a logic function or a portion of a logic function. The logic cell can include circuitry that provides basic functions such as, for example, AND, OR, XOR, XNOR, inverter, flipflop, latch, etc., and/or circuitry to provide more complex functions. "Track" as used herein is a predetermined route on which a connection line can be deposited. "Connection line" as used herein is one or more layers of deposited material that provide a connection between two or more components in the memory device. The connection line can be one or more layers composed of, for example, metal, metal alloy, polysilicon, and/or some other composition, that is deposited on the substrate or within the substrate, including components on or within the substrate (e.g., oxide layers, a trench isolation region, an active area, etc.) of a memory device.

Figure 1A:
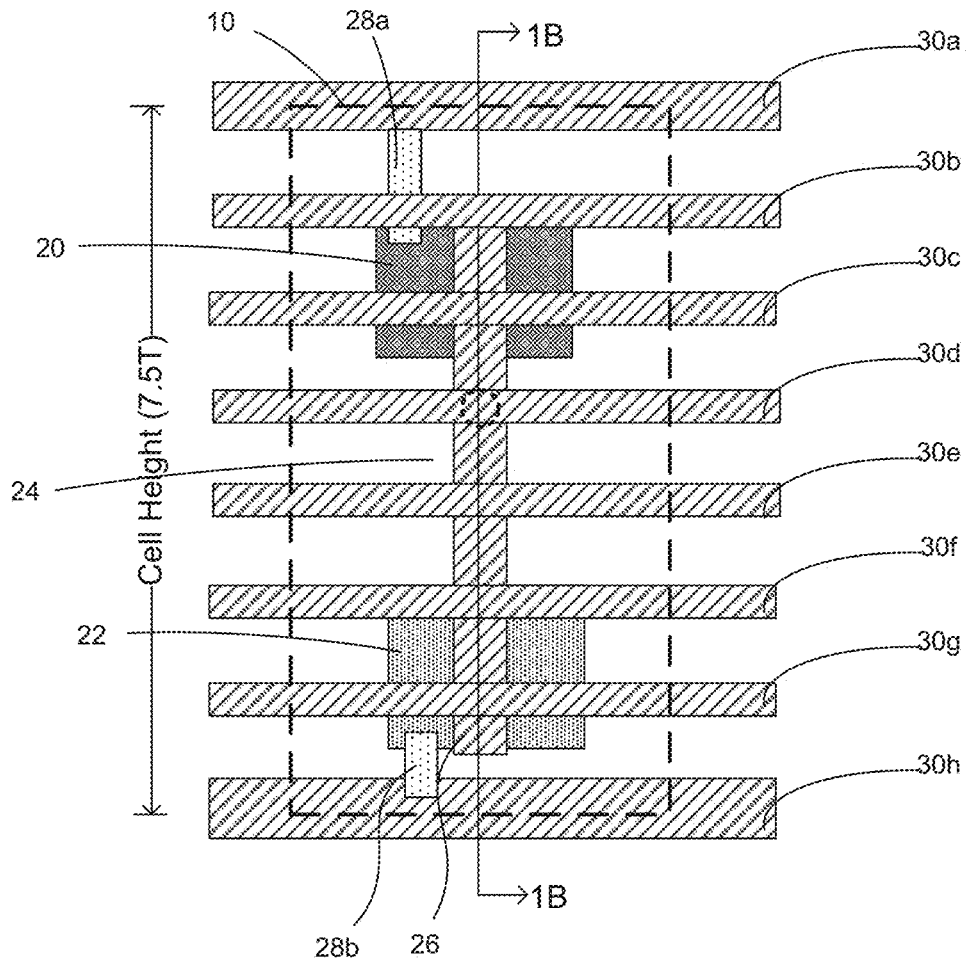
FIGS. 1A and 1B respectively illustrate top and cross-sectional views of a generic standard logic cell without a buried connection line.
Figure 1B:
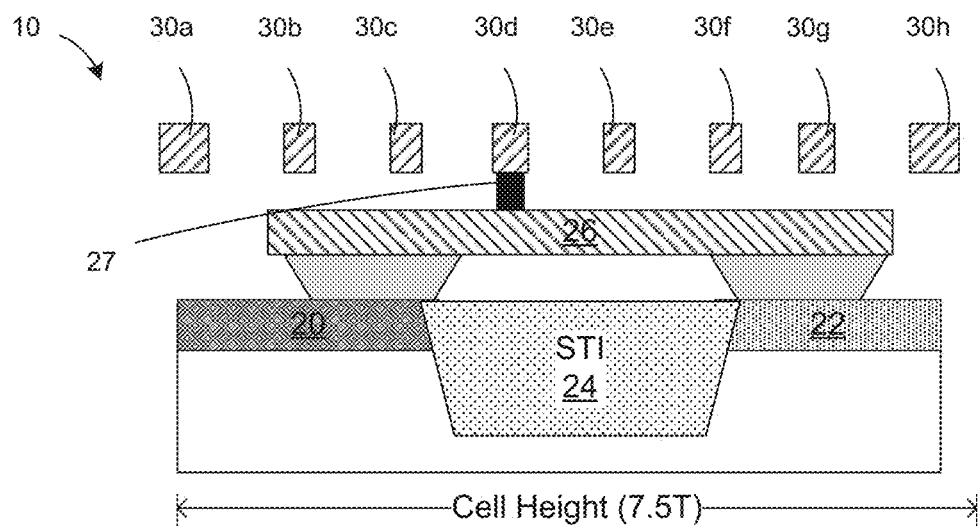

FIGS. 1A and 1B respectively illustrate a top and cross-sectional views of a generic standard cell 10. The standard cell 10 can have active areas 20 and 22 that are separated by a shallow trench isolation (STI) portion 24. The active areas 20 and 22 can include an arrangement of PMOS and/or NMOS transistors based on the type of logic function being implemented (e.g., AND, OR, XOR, XNOR, inverter, flip-flop, latch, etc.). A standard cell can include one or more row and column connection lines formed along predetermined tracks in the row and column directions of the standard cell. The row and column directions respectively correspond to the horizontal and vertical directions in FIG. 1A. The connection lines can provide intra-cell and/or inter-cell connections for power (e.g., VCC, GND, etc.) and/or signals (e.g., data, clock, command, etc.). Depending on the function, the connection lines can be metal layers, metal alloy layers, and/or polysilicon layers (or layers having another composition). The standard cell 10 can have a column connection line 26 that is a polysilicon layer between the active areas 20 and 22 to connect components in the active areas such as, for example, gates of transistors in the respective areas, and column connection lines 28a,b can be metal layers that connect source/drains of transistors to the respective power rail, which can be connected power sources. In addition, the standard cell 10 includes row connection lines 30a-30h (collectively "30") that can be metal layers, metal alloy layers, and/or polysilicon layers (or a layer or layers having another composition) depending on the function. For example, the row connection lines 30a and 30h can correspond to power rails composed of metal layers that that connect to power sources (e.g., VCC, GND, etc.), and the connection lines 30b-30f can be composed of an appropriate material (metal, metal alloy, polysilicon, and/or another appropriate material or alloy) for the transmission of intra-cell and/or inter-cell signals such as data signals, clock signals, command signals, etc. Depending on the circuit's function, other types of standard cells can have any number of connection lines (up to the respective pitch limits) extending in the row and/or column directions and the layers can be composed of an appropriate material for the circuit. The connection lines can provide connections between the active areas of a cell, connections within an active area of a cell, and/or connections between cells. Some connection lines can pass through a particular cell without connecting to a component within the cell. The row and column connection lines can be deposited at different elevations on the substrate. For example, as seen in FIG. 1B, the column connection line 26 can be disposed above the active areas 20 and 22 and the row connection lines 30 can be routed above the column connection line. Any required connections between the upper and lower connection lines can be made using, for example, local interconnection contacts (licon). For example, a licon 27 can connect the column connection line 26 with the row connection line 30d.

The height of a standard cell can correspond to the number of tracks that can be accommodated by the standard cell. One track is approximately the minimum spacing or pitch between adjacent rows. Thus, the cell height can be the row pitch multiplied by the number of tracks and tracks can be used as a unit to define the height of the standard cell (e.g., a 6-track cell, 7.5-track cell, a 9-track cell, a 12-track cell, etc.). A 12-track cell will be taller than a 9-track cell and more routing space is available within the cell for the row connection lines. Thus, the 12-track cells will have less congestion with respect to routing the connection lines. In contrast, the routing congestion in a 9-track cell is higher in comparison to a 12-track cell, but a 9-track cell will be more compact (less cell area). In the example of FIG. 1A, standard cell 10 has a cell height of 7.5 T (taking into account power rails that extend into the neighboring cell). The cell width can be similarly calculated by those skilled in the art.

As discussed above, it is desirable to reduce memory cell array size while maintaining and/or increasing array efficiency. However, as memory cell arrays get denser and smaller, the peripheral logic circuits must also get denser and smaller in order to maintain the same array efficiency. For example, if the memory array size is reduced, then the size of the convention logic cell (e.g., a standard cell as discussed above) will also need to be reduced (e.g., reduction in cell height and/or cell width) in order to maintain the same array efficiency. However, as discussed above, a reduction in cell size can mean a reduction in the number of available tracks for the routing connection lines, which means fewer routing options and more congestion. In exemplary embodiments of the present disclosure, in comparison to an equivalent conventional logic cell, the number of connection lines can remain the same or even be increased while decreasing the logic cell area (e.g., reducing the cell height) and/or for an equivalent conventional cell size, the number of connection lines can be increased. Accordingly, in exemplary embodiments of the present disclosure, memory cell size can be decreased and/or the number of connection lines can be increased without reducing array efficiency.

Embodiments of the present technology are directed to an apparatus (e.g., a memory device) with a semiconductor substrate and a memory cell array disposed on the substrate. The apparatus also includes a logic cell disposed on the substrate in a peripheral region adjacent the memory cell array. The apparatus can include a trench isolation region disposed in the substrate in the peripheral region. The trench isolation region can separate a first active area (e.g., a PMOS region) of the logic cell from a second active area (e.g., an NMOS region) of the logic cell or can separate the logic cell from an adjacent logic cell. The logic cell can include a connection line that is buried within the trench isolation region, and the connection line can correspond to a signal connection line or a power connection line. In some embodiments, the connection line in the peripheral region can be an extension of a buried word line that has been formed in the memory cell array region. That is, the connection line can be formed during a same fabrication process that forms the corresponding buried word line in the memory cell array region. In this way, the buried connection line can be formed without additional processing (e.g., without a separate buried connection line fabrication process for the peripheral region), saving time and/or simplifying the fabrication process with respect to masks, etching, and material deposition, for example.

Figure 2A:
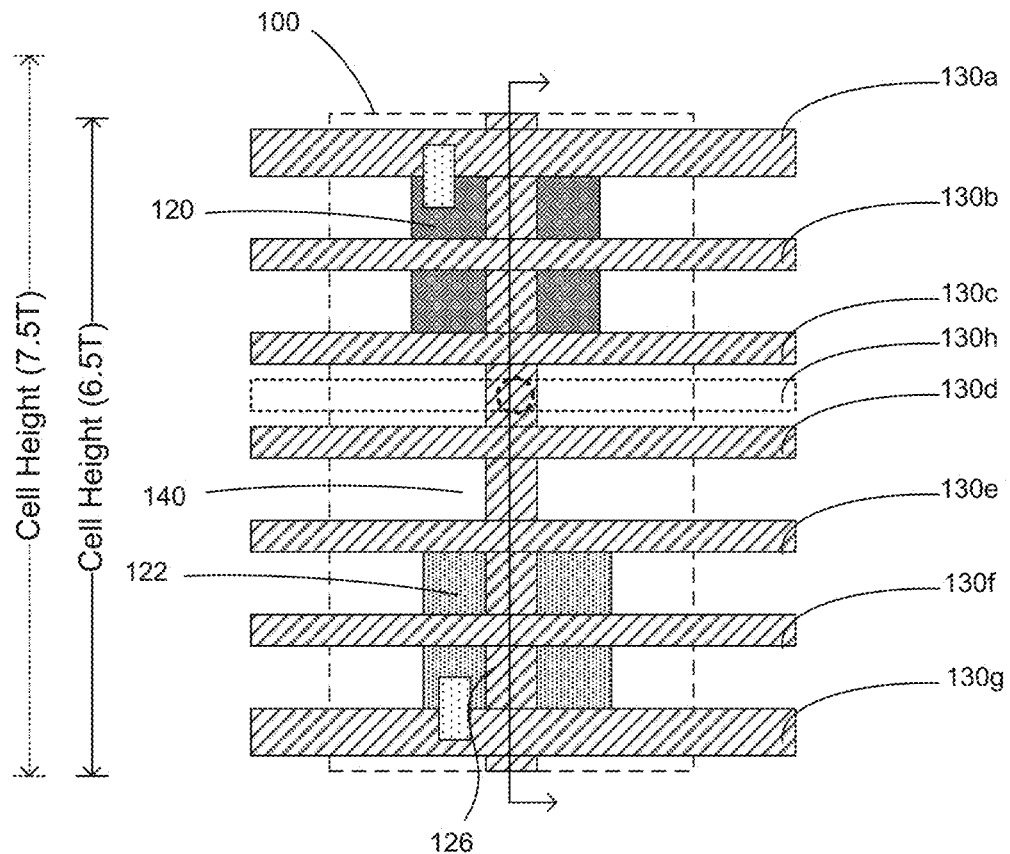
FIGS. 2A and 2B respectively illustrate top and cross-sectional views of a generic logic cell in accordance with an embodiment of the present disclosure.
Figure 2B:
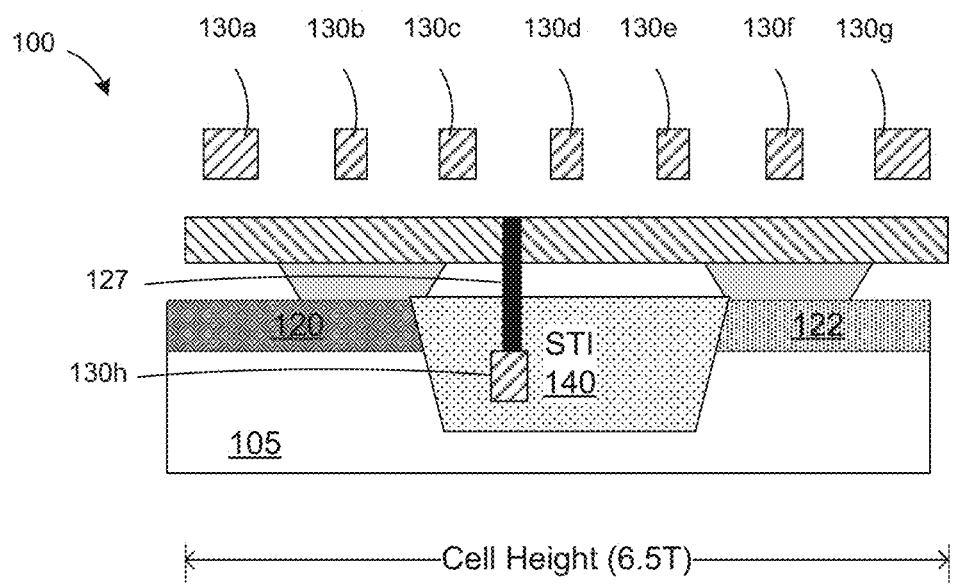

FIGS. 2A and 2B respectively illustrate top and cross-sectional views of a generic logic cell 100 that includes tracks in accordance with an embodiment of the present technology. Similar to standard cell 10, logic cell 100 includes active areas 120 and 122 separated by a trench isolation region 140. The active areas 120 and 122 respectively can be PMOS and NMOS regions that include an arrangement of transistors based on the type of logic being implemented (e.g., AND, OR, XOR, XNOR, inverter, flip-flop, latch, and/or other integrated circuit functions). Similar to standard cell 10, the logic cell 100 can include one or more connection lines formed along predetermined tracks in the row and column directions of the logic cell 100. The components of logic cell 100 are similar to those of standard cell 10 and thus, for brevity, a detailed description is omitted, except as needed to describe the present embodiment. In the following description, for brevity, exemplary embodiments of the present disclosure are discussed with respect to cell height and row connection lines. However, those skilled in the art recognize that the concepts described herein can be applied to cell width and corresponding column connection lines, where applicable.

As seen in FIGS. 2A and 2B, the logic cell 100 includes connection lines 130a-g (collectively "130") formed above the column connection line 126. Connection lines 130a and 130g can be power connection lines and connection lines 130b-f can be signal connection lines. The number of connection lines 130 is seven, which is one less than the number of connection lines 30 in standard cell 10. Thus, the minimum cell height of logic cell 100 can be less than the minimum cell height of standard cell 10. For example, the minimum cell height of logic cell 100 is 6.5 T while the minimum cell height of standard cell 10 is 7.5 T. However, unlike a conventional logic cell where a reduction in cell height can mean a reduction in the number of tracks in the row direction, embodiments of the present technology include one or more buried connection lines so that the number of tracks can remain the same or even increase in comparison to a conventional standard logic cell. That is, for equivalent cell heights, exemplary embodiments of the present disclosure can have a greater number of available row tracks in comparison to a conventional logic cell (e.g., the conventional standard cell of FIGS. 1A and 1B) by burying one or more connection lines. Accordingly, as memory cell arrays get smaller, in exemplary embodiments of the present disclosure, the cell height can also get smaller while keeping the same number of tracks as before the cell height reduction. In addition, the array efficiency is not adversely affected because the logic cell height can be appropriately reduced when the memory cell array is reduced.

As seen in FIGS. 2B, logic cell 100 includes a buried connection line 130h that is formed in the substrate 105 under the active areas 120 and 122. In some embodiments, the buried connection line 130h can be located in trench isolation region 140 separating active areas 120 and 122. In some embodiments, more than one connection line can be buried in trench isolation region 140. The number of connection lines the trench isolation region can accommodate can be based on the cross-sectional area of the trench isolation region and the minimum pitch required by the connection lines. In some embodiments, the trench isolation region 140 can be a STI. However, in other embodiments, the trench isolation region can be a deep trench isolation.

The buried connection line 130h can be a signal connect line (e.g., data signals, command signals, clock signals, etc.) In some embodiments, the buried connection line 130h can be a metal layer. However, depending on the function, the buried connection line 130h can be composed of a material other than a metal. To access a buried connection line, one or more licons can be formed between the buried connection line and a connection line (or other component) located in an upper elevation. For example, as seen in FIG. 2B, a licon 127 can be formed between buried connection line 130h and the connection line 126, which can be, for example, a polysilicon layer connecting transistor gates in the active areas 120 and 122.

Figure 3:
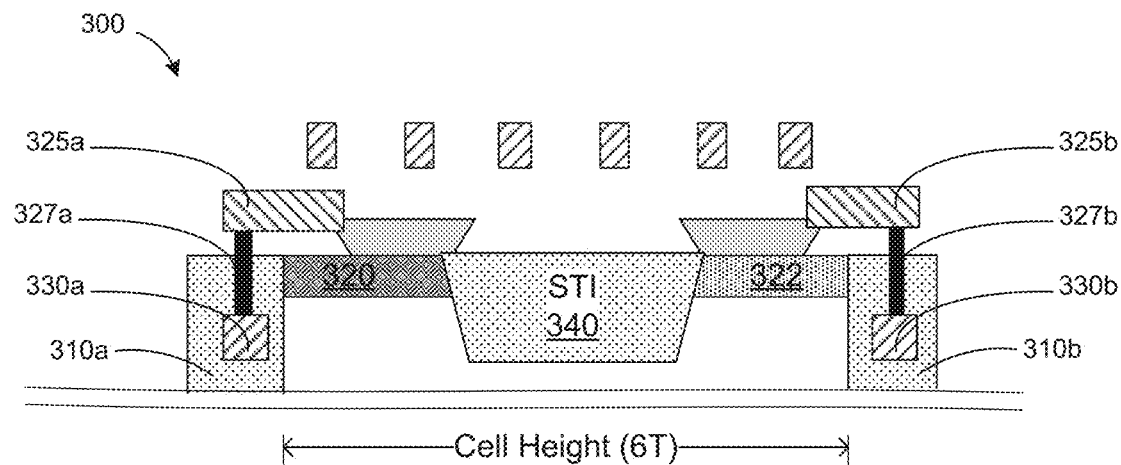
FIG. 3 illustrates a cross-sectional view of a logic cell in accordance with another embodiment of the present disclosure.

FIG. 3 illustrates a cross-sectional view of another embodiment of the present disclosure. In some embodiments, the logic cell can include one or more power connection lines that are buried. In some embodiments, the power connection lines can be buried in a trench isolation region (e.g., a STI or a deep trench isolation). For example, as seen in FIG. 3, logic cell 300 includes power connection lines 330a,b that are buried in respective trench isolation regions 310a,b located adjacent the corresponding active areas 320, 322 of the logic cell 300. The power connection lines 330a,b can be connected using licons 327a,b to the respective metal layers 325a,b. The metal layers 325a,b can connect to the source of the transistors in the respective active areas 320,322, which can be respectively be PMOS and NMOS regions. The active areas 320, 322 can be separated by a trench isolation region 340. The power connection lines 330a,b can represent power rails that connect to power sources such as, for example, VCC, GND, etc. The type of power source can depend on the type of circuit in logic cell 300. In some embodiments of the present disclosure, the logic cell 300 can include one or more buried power connection lines and one or more buried signal connection lines. Because one or more power rails for the logic cell can be buried in a trench isolation region (e.g., trench isolation regions 310a,b) that separates logic cell 300 and an adjacent logic cell, similar to embodiment of FIGS. 2A and 2B, the cell height logic cell 300 can be decreased without decreasing the number of tracks and/or the number of tracks can be increased without increasing the cell height. For example, logic cell 300 has the same number of row connection lines and that of standard cell 10, but because the power rails are buried, the cell height of logic cell can be decreased to 6 T from a cell height of 7.5 T. The number of power connection lines that can fit in the respective trench isolation regions 310a,b can depend on the cross-sectional area of trench isolation regions 310a,b and the minimum pitch required by the connection lines.

Figure 4:
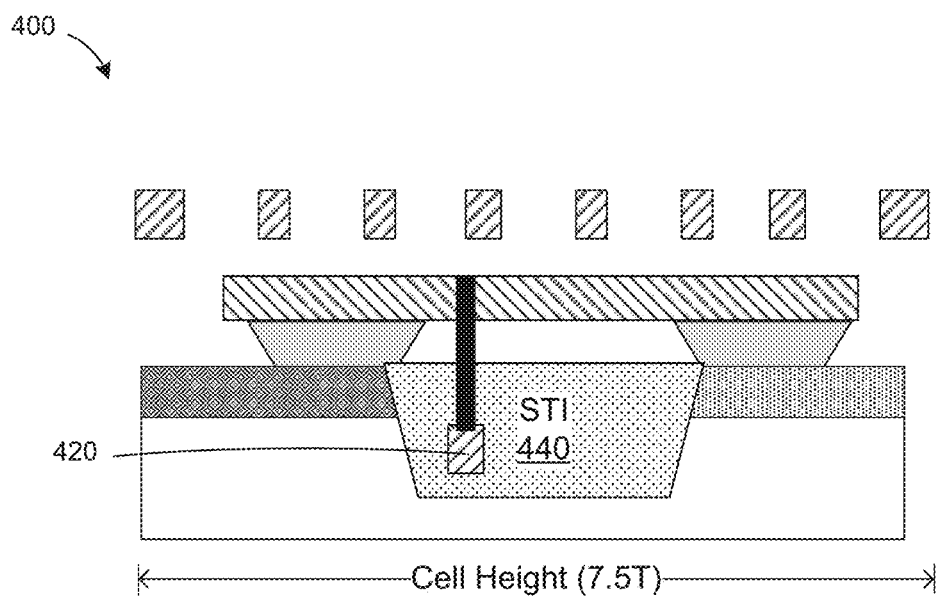
FIG. 4 illustrates a cross-sectional view of a logic cell in accordance with another embodiment of the present disclosure.

FIG. 4 illustrates a cross-sectional of another embodiment of the present disclosure. The logic cell 400 of FIG. 4 is similar to the standard cell 10 of FIGS. 1A and 1B, but the logic cell 400 includes an additional row connection line. As seen in FIG. 4, logic cell 400 includes a buried signal connection line 420 in the trench isolation region 440. Thus, while the cell of logic cell 400 is the same as the cell height of standard cell 10 (e.g., 7.5 T), logic cell 400 has more tracks for routing, which can, for example, provide greater flexibility and less congestion for automatic place and route tools. In other embodiments, the logic cell 400 can include more than one buried signal connection line and/or include one or more buried power connection lines. The number of connection lines that can fit in the trench isolation region 440 can depend on the cross-sectional area of the trench isolation region 440 and the minimum pitch required by the connection lines. Thus, embodiments of the present disclosure provide for a greater number of tracks in comparison to conventional cell having equivalent cell heights.

Figure 5A:
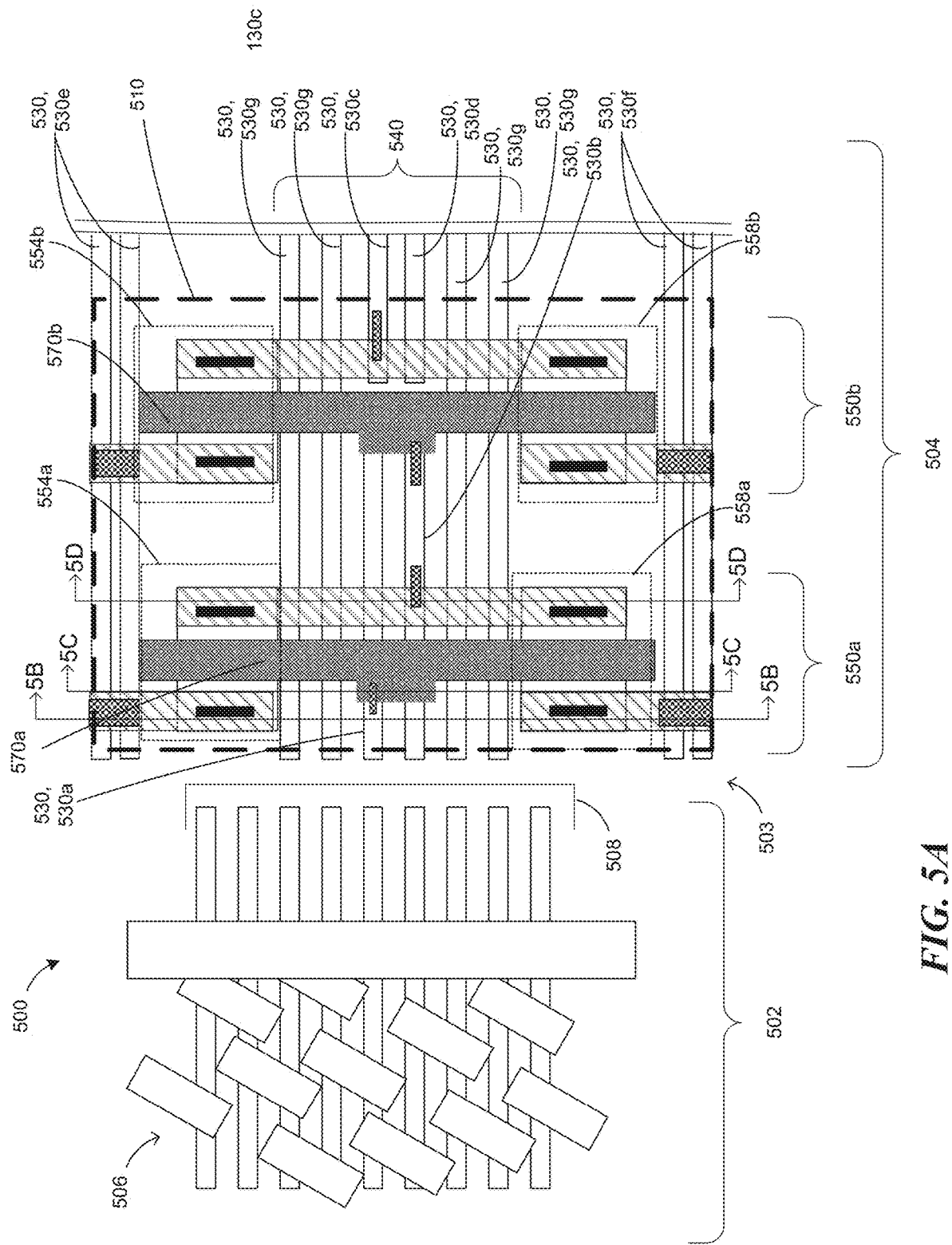
FIG. 5A illustrates a top view of a logic cell in accordance with another embodiment of the present disclosure.

FIG. 5A illustrates a simplified top view of a portion of a memory device 500 in accordance with an exemplary embodiment. Memory device 500 can include a memory cell array 506 located in a memory cell array region 502, which can include one or more memory cell arrays, and a logic cell 510 located in a peripheral region 504, which can include one or more logic cells. A gap region 503 can be located between the memory cell array region 502 and the peripheral region 504. Memory cell array 506 includes a plurality of memory cells arranged in a manner that is known in the art. Accordingly, a detailed description of the memory cell array 506 is omitted except as needed to describe the exemplary embodiments. In some embodiments, the logic cell 510 can have predetermined row and/or column tracks such that automated tools can design the layout of circuitry in the peripheral region 504, which can include any combination of standard cell circuits and non-standard cell circuits. In the exemplary embodiment of FIG. 5A, logic cell 510 includes two inverter circuits 550a and 550b in which the output of inverter circuit 550 is connected to the input of inverter circuit 550b. The logic cell 510 can be, for example, a portion of a sense amplifier. Other logic cells having different functions can then be arranged around logic cell 510 to complete the sense amplifier circuit. In other embodiments, the logic cell can include circuitry for other functions or portions of other functions. That is, the circuit of logic cell 510 is an exemplary circuit that is provided as an aid in explaining various aspects of the present disclosure. The present disclosure, however, is not limited to the logic circuit shown in FIG. 5A and the concepts discussed herein can be applied to other types of logic circuits disposed in the peripheral region 504. In some embodiments, logic cells in accordance with the present disclosure can be included as standard logic cells in libraries for use by automatic place and roue tools in designing the peripheral circuitry.

Figure 5B:
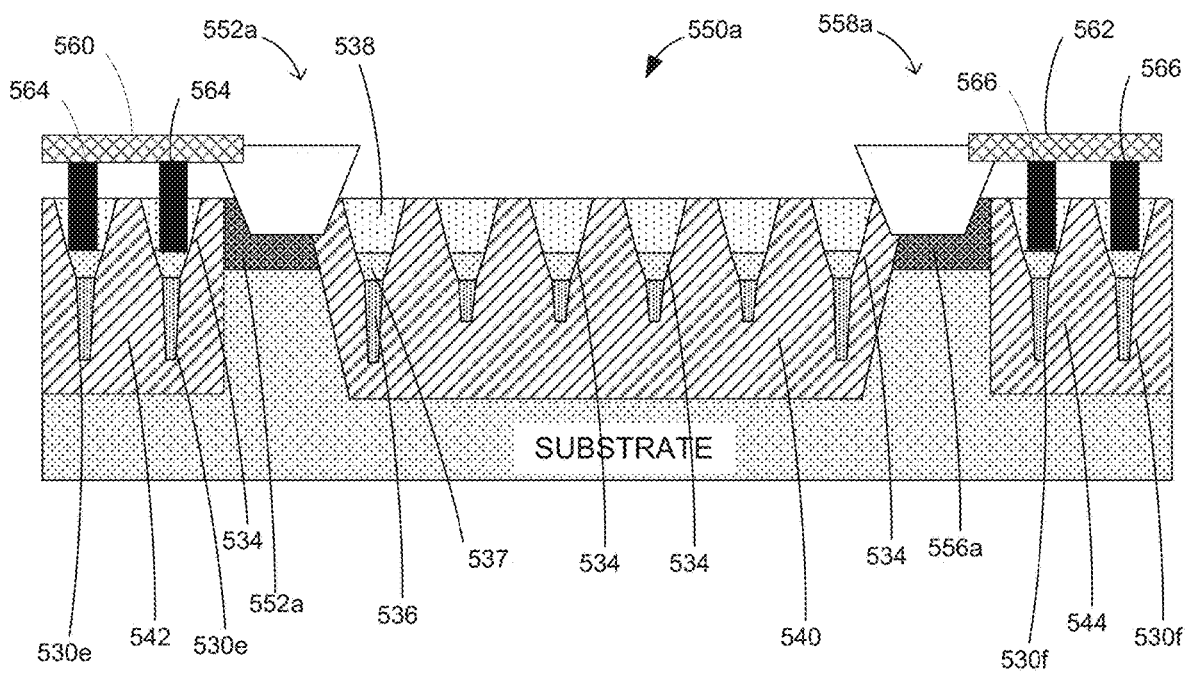
FIGS. 5B to 5D illustrate various cross-sectional views of the logic cell in FIG. 5A.
Figure 5C:
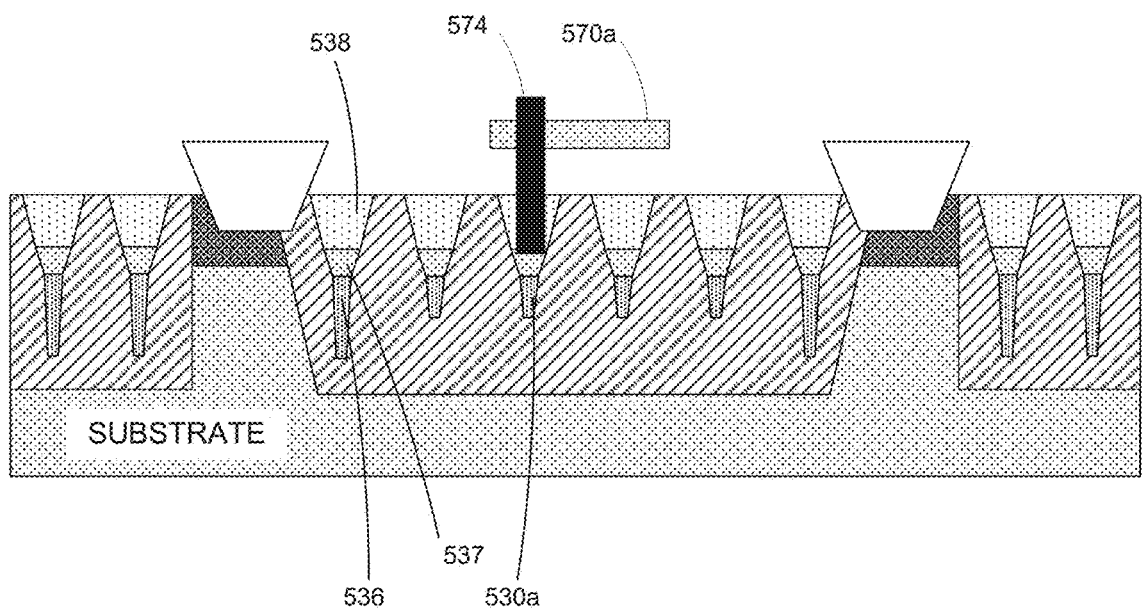
Figure 5D:
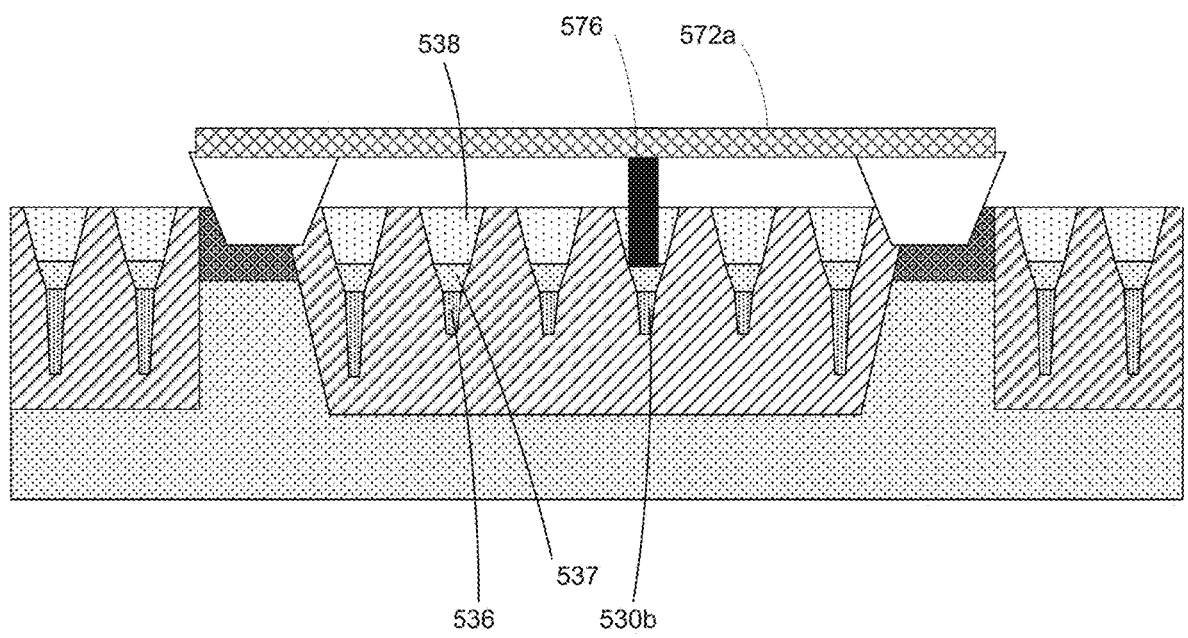

FIGS. 5B to 5D are different cross-section views of the inverter circuit 550a that show the source connections to the power sources, the gate connections to the input, and the drain connections to the output, respectively. Because the construction of inverter circuit 550b to inverter circuit 550a, cross-sectional view of inverter 550b are omitted, for brevity. As seen in FIGS. 5A to 5D, inverter circuit 550a can include an active area 552a with a PMOS transistor 554a and an active area 556a with NMOS transistor 558a. Active areas 552a and 554a can be separated by a trench isolation region 540. Similarity, inverter circuit 550b can include an active area with a PMOS transistor 554b and an active area with NMOS transistor 558a. The trench isolation region 540 can also separate active areas of inverter circuit 550b.

As seen in FIG. 5A, connection lines 530 can be formed in a row direction across logic cell 510. The connection lines 530 (along with appropriate contacts) can provide intra-cell connections and/or inter-cell connections for transmitting signals and/or power. For example, connection line 530a can provide an inter-cell connection for the inverter circuit 550a to receive the input signal from another logic cell or circuit and connector line 530b can provide an intra-cell connection for transmitting the output of inverter 550a to inverter 550b. In addition, connection line 530c can provide an inter-cell connection for transmitting the output of inverter circuit 350b. In some embodiments, as in the case of connection line pair 530a and 530c and line pair 530b and 530d, the row connector lines represent segmented row connection lines that are formed along the same track but are electrically isolated from each other by a break or breaks in the connection line. Thus, a single track-path can have two or more connection line segments. Connection lines 530e and 530f can correspond to power rails that provide inter-cell connections to a power source (VCC, GND, etc.). In the embodiment of FIG. 5A each power rail includes two row connection lines. However, in other embodiments, a power rail can be one connection line or more than two connection lines. In some embodiments, the row connection lines intended for another cell can pass through the current cell without connecting to components in the logic cell. For example, row connection lines 530g can be routed through the logic cell 510 without connecting to any of the components in the logic cell 510. These connection lines can be used by other circuits in the peripheral region 504.

In some embodiments, one or more connection lines 520 can be a buried connection line. The buried connection lines 530 can be located in the trench isolation region 540 (e.g., for signal connection lines) and/or trench isolation regions 542 and 544 (e.g., for the power rails—see FIG. 5B). In the embodiment of FIG. 5A, all of the connection lines 530 are buried. However, as discussed above with respect to the embodiments of FIGS. 2A and 2B, embodiments of the present disclosure can include a combination of buried and non-buried connection lines. The number of signal/power connection lines that can be buried in the respective trench isolation regions can depend on the cross-sectional areas of the trench isolation regions and the minimum pitch required by the connection lines. In some embodiments, the buried connection line(s) 530 in the peripheral region 504 can be formed separately from the formation of buried lines in other regions such as, for example, the buried word lines 508 of the memory cell array region 502. However, as discussed further below, in other embodiments, to save processing steps, the buried connection lines 530 can be formed in conjunction with the formation of buried word lines 508 of one or more memory arrays such as, for example, memory cell array 506.

The formation of the buried connection lines can use known methods and those skilled in the art understand the details of a fabrication process for buried metal lines. Thus, for brevity, details related to photoresist layers, masks, chemical and/or plasma etching, and other known details are omitted. FIGS. 5B to 5D show cross-sectional views of buried connection lines 530. In some embodiments, to create the buried connection line 530, a connection line pattern is formed on a photoresist layer on a substrate and/or the trench isolation region 540 (or on an oxide covering the substrate or isolation region). After creating the line pattern, an etching process is then performed to create the contact line trenches 534 (for clarity, only a few trenches are labeled in FIG. 5B) at a predetermined depth range in the underlying substrate and/or trench isolation layer. In some embodiments, the depths of the trenches 534 need not be the same. In some embodiments, the tops of the buried connection lines 530 are processed to be on approximately the same plane. After the contact line trenches 534 are formed, a metal layer 536 that can be composed of, for example, titanium, titanium nitride, tungsten, and/or another appropriate metal or alloy or material, can be deposited in the trenches 534. For clarity, only one metal layer 536 is labeled in FIG. 5B, but those skilled in the art understand that all the buried connection lines 530 can be formed in a similar manner. After deposition of the metal layer 536 in the line trenches 534, a chemical mechanical planarization (CMP) process is performed. In some embodiments, a polysilicon layer 537 (or another appropriate material) can be deposited on the metal layer 536 and subsequent CMP process can be performed. After the metal and/or polysilicon layer deposition, in some embodiments, a nitride (oxide) isolation layer 538 (or another appropriate material) can be deposited. The connections between the buried connection lines 530 to the various components in the inverters 550a,550b are discussed below.

As seen in FIG. 5A and the cross sectional view of FIG. 5B, the sources of the PMOS transistors 554a,b can be connected to, for example, a power rail (e.g., VCC) by respective metal layers 560 (see FIG. 5B, for clarity only transistor 550a is labeled), and the sources of the NMOS transistors 556a,b can be connected to, for example, a power rail (e.g., GND) by respective metal layers 562 (see FIG. 5B, for clarity only transistor 550a is labeled). In this exemplary embodiment, the connection lines 530e in trench isolation region 542 (e.g., power rail VCC) and connection lines 530f in trench isolation region 544 (e.g., power rail GND) are buried connection lines, similar to the embodiment of FIG. 3. The buried connection lines 530e can connect to the corresponding source metal layers 560 using licons 564, made of a metal (e.g., titanium, titanium nitride, tungsten, and/or another appropriate metal or alloy or material). Similarly, buried connection lines 530f can connect to the corresponding source metal layers 562 using licons 566, made of a metal (e.g., titanium, titanium nitride, tungsten, tungsten nitride or another appropriate metal). To create the licons 564,566, after creating a contact pattern in a photoresist layer for the licons 564, 566, an etch operation can be performed through any oxide of the trench isolation regions 542, 544 and through any isolation layer 538 (e.g., nitride layer) of the buried connection line 530e, 530f to create a contact trench having a depth that exposes the metal layer 536 and/or the polysilicon layer 537 of the buried connection line 530e, 530f. After the etch process, the metal (e.g., titanium, titanium nitride, tungsten, and/or another appropriate metal or alloy or material) can be deposited in the contact trench for the licon and a CMP can be performed on the deposited metal column. In the above embodiments, VCC and GND are used as the power sources. However, the present disclosure is not limited to these power sources and other power sources can be used based on the circuit being powered.

As seen in FIG. 5A and the cross-sectional view of FIG. 5C, the gates of the respective transistors in each inverter circuit 550a,b can be connected to each other by a polysilicon layer 570a, 570b, which can carry an input signal to the corresponding inverter circuit 550a,b. Although FIG. 5C shows a cross-sectional view of inverter circuit 550a, the description is also valid for inverter circuit 550b. The polysilicon layer 570a,570b can be connected to the appropriate buried connection line (e.g., buried line 530a for inverter circuit 550a and buried line 530b for inverter circuit 550b) by licons 574 (for clarity, only the licon for inverter 550a is shown in FIG. 5C). The licons 574 can be made of a metal (e.g., titanium, titanium nitride, tungsten, and/or another appropriate metal or alloy or material). Similar to the power rail licons 564,566 discussed above, after creating a contact pattern in a photoresist layer for the licons 574, an etch operation can be performed through any polysilicon layer 570a and/or any oxide of the trench isolation region and through any isolation layer 538 (e.g., nitride layer) of the buried connection line 530a, 530b to create a contact trench having a depth that exposes the metal layer 536 and/or the polysilicon layer 537 of the buried connection line 530a, 530b. After the etch process, the metal (e.g., titanium, titanium nitride, tungsten, and/or another appropriate metal or alloy or material) can be deposited in the contact trench for the licon and a CMP can be performed on the deposited metal column.

As seen in FIG. 5A and the cross-sectional view of FIG. 5D, the drains of the respective transistors in each inverter circuit 550a,b can be connected to each other by a metal layer 572a,b (cross-hatched), which can carry an output signal of the corresponding inverter circuit 550a,b. Although FIG. 5D shows a cross-sectional view of inverter circuit 550a, the description is also valid for inverter circuit 550b. The metal layer 572a,572b can be connected to the appropriate buried connection line (e.g., buried line 530b for inverter circuit 550a and buried line 530c for inverter circuit 550b) by licons 576 (for clarity, only the licon for inverter 550a is shown in FIG. 5C). The licons 576 can be made of a metal (e.g., titanium, titanium nitride, tungsten, and/or another appropriate metal or alloy or material). Similar to the power rail licons 564,566 discussed above, after creating a contact pattern in a photoresist layer for the licons 576, an etch operation can be performed through any oxide of the trench isolation region and through any isolation layer 538 (e.g., nitride layer) of the buried connection line 530b, 530c to create a contact trench having a depth that exposes the metal layer 536 and/or the polysilicon layer 537 of the buried connection line 530a, 530b. After the etch process, the metal (e.g., tungsten, tungsten nitride, or some other appropriate material or alloy) can be deposited in the contact trench for the licon and a CMP can be performed on the deposited metal column.

In some embodiments, the memory cell array 506 can include buried word lines that can then be modified to form buried connection lines. In conventional systems, during formation, buried word lines 508 extend only to the edge of the peripheral region 504. For example, the buried word line mask can stop at the edge of the memory cell array area 502 and/or the portions of the buried word line formed in the peripheral region are subsequently etched. However, in exemplary embodiments, during formation, the buried word lines 508 extend at least a portion into the peripheral region 504 and, in some embodiments, the buried word lines 508 extend the entire width of the peripheral region 504. Thus, the connection line(s) 530 in the peripheral region can be an extension of corresponding buried word line(s) 508 that is formed in the memory cell array region 502. In some embodiments, when the buried word line(s) 508 are being formed, the connection line(s) 530 can be also be formed at the same time as part of the same buried-line fabrication process. By having the buried word line(s) 508 extend into the peripheral region 504, the buried connection line(s) 530 can be formed without additional processing. Accordingly, based on the layout of the logic cell(s), a separate buried connection line fabrication process for the logic cell(s) in the peripheral region 504 is not needed or can be limited in scope, which can save time and/or simplify the fabrication process with respect to masks, etching, and material deposition, for example. After forming the extended word lines 508, an etching operation is performed to isolate the peripheral region 504 from the memory cell array 506 to create a set of buried connection lines. Additional etching operations can be performed to remove unwanted buried word lines and/or unwanted buried connection lines and/or unwanted buried connection line segments from the peripheral region 504, based on the function of the logic cell(s).

Figure 6A:
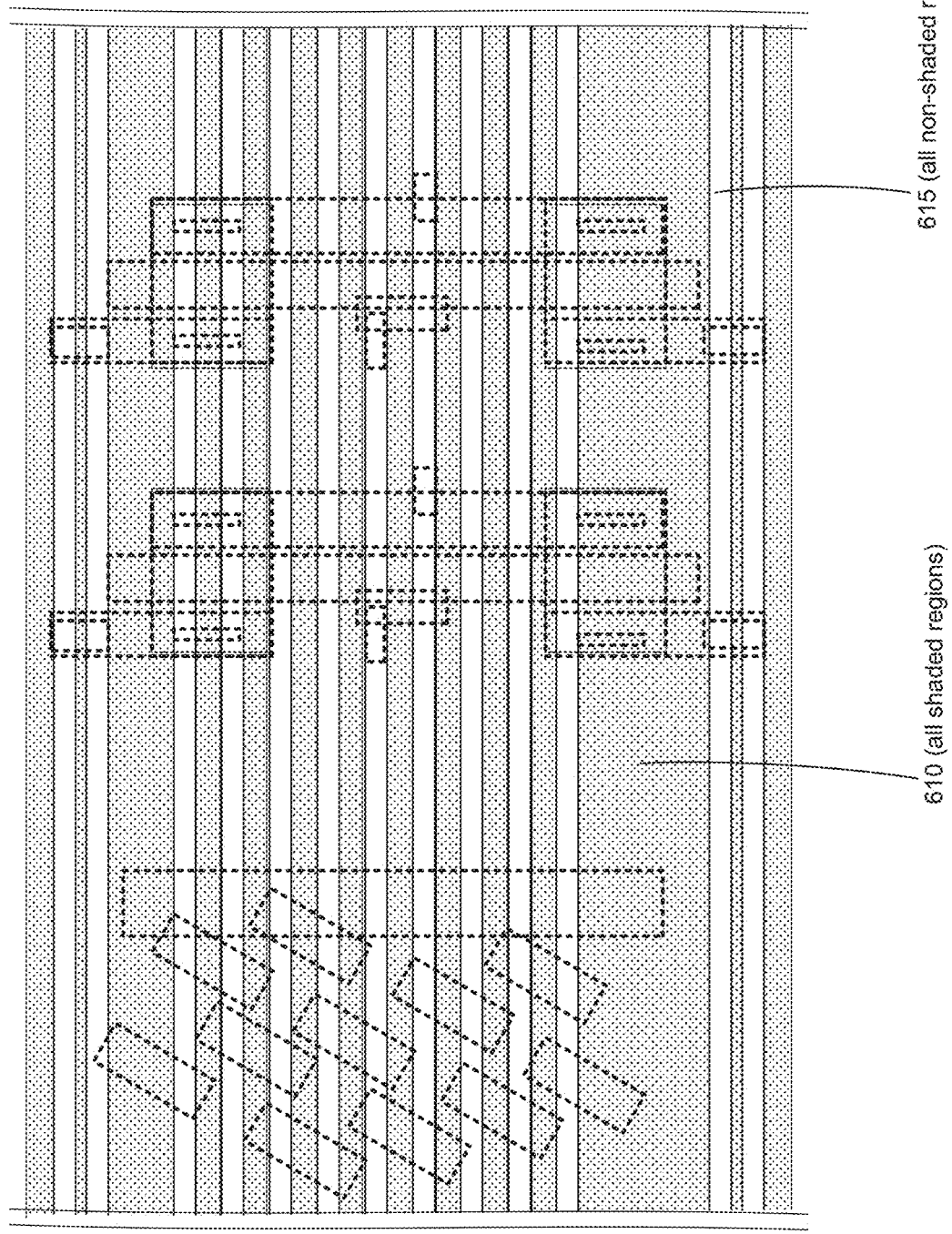
FIG. 6A illustrates a buried connection line mask in accordance with an embodiment of the present disclosure.

For example, FIG. 6A provides a simplified mask/etching pattern for the creation of buried metal lines that can be configured as buried word lines and buried connection lines. Those skilled in that understand the details of a fabrication process for a CMOS circuits and thus, for brevity, details related to photoresist layers, masks, chemical and/or plasma etching, and other known details are omitted. In FIG. 6A, buried line mask 610 (all shaded regions), which can be a combination of photo and etch steps, can cover the substrate and have openings 615 (all non-shaded regions) corresponding to the placement of the buried metal lines. The dotted outlines show the placement of the other components in the memory cell array region 502 and the peripheral region 504. In some embodiments, to reduce the number of processing steps, the buried metal line mask process that creates the buried word lines of a memory cell array such as, for example, buried word lines 508 can be extended into the peripheral region 504. The process of forming the buried metal lines includes depositing photoresist layer over the substrate (or over an oxide layer covering the substrate) and/or depositing the photoresist layer over a trench isolation region (e.g., a shallow trench isolation) formed in, for example, a portion of the peripheral region 504 (or over an oxide layer covering the trench isolation layer). The photoresist layer is then patterned to create a buried line mask 610 that can be used to etch the underlying substrate and/or trench isolation layer.

Figure 6B:
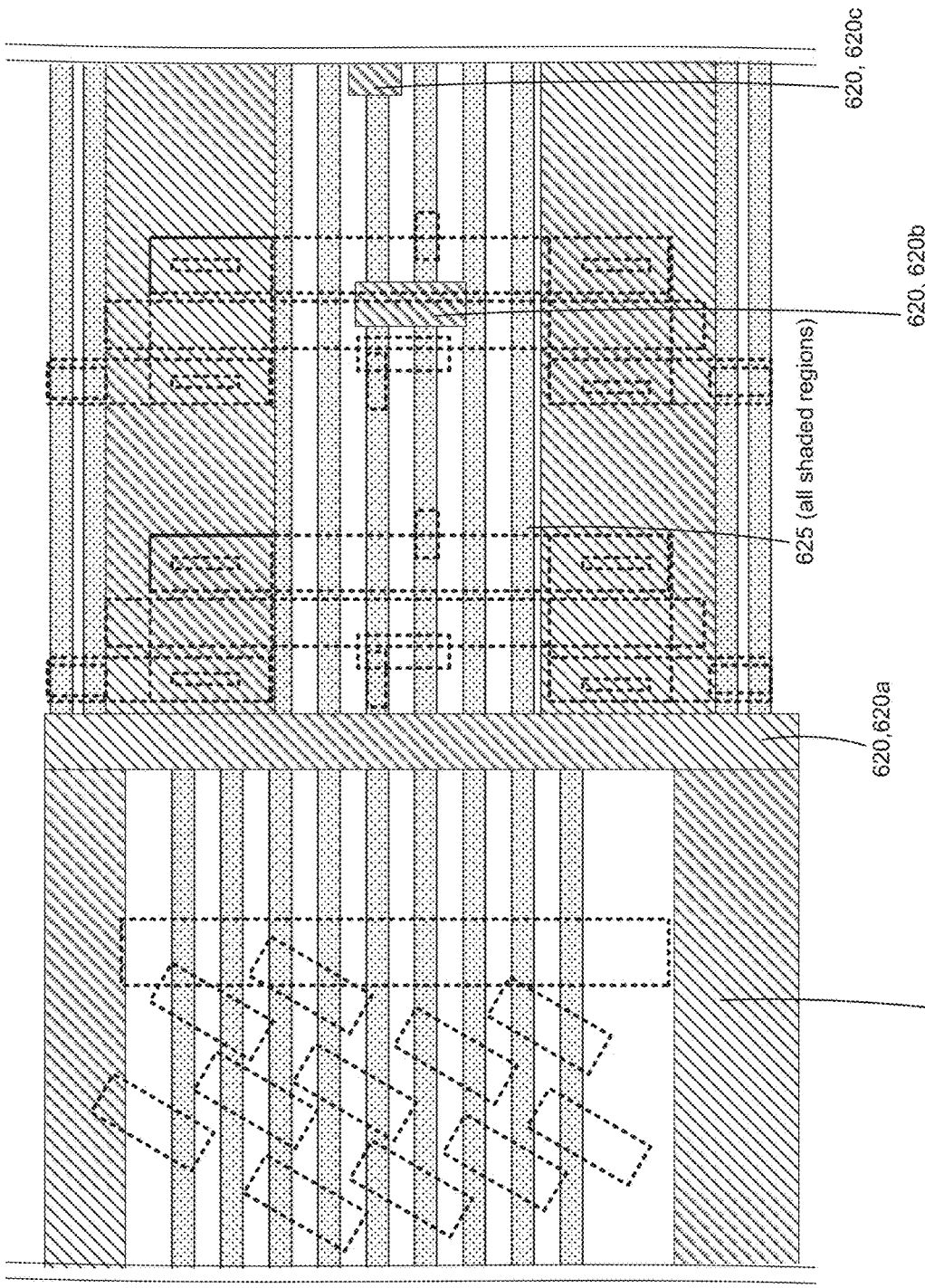
FIG. 6B illustrates a chop mask in accordance with an embodiment of the present disclosure.

However, not all the buried metal lines created by the mask 610 are needed in some areas. In addition, the buried word lines 508 of the memory cell array 506 should be isolated from the buried connection lines 530, and some of the buried connection lines 530 may need to be segmented based on the logic circuit, as discussed above. Accordingly, a chop operation can also be performed to remove buried metal lines from areas that should not have buried word lines and/or buried connection lines. As seen in FIG. 6B, a chop mask 620 (cross-hatched region), which can be a combination of photo and etch steps, is used to remove the buried metal lines from areas where the buried metal lines are not wanted. The shaded buried metal lines 625 represent the required buried word and connection lines that should not be removed. As seen in FIG. 6B, chop mask portion 620a ensures that the buried metal lines in the memory cell array region 502 are separate from the buried metal lines in the peripheral region 504 by creating a gap region 503 (see FIG. 5A). Thus, after the chop operation, one or more buried word lines 508 and one or more of the buried connection lines 530 linearly align with each other. In addition, chop mask portion 620b ensures that the intra-cell connection lines for the invert circuits 550a and 550b are segmented properly, and chop mask portion 620c ensures that buried connection line 530c, which corresponds to the output of the inverter circuit 550b is segmented from other logic cells.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
   a substrate;
   a memory cell array disposed on the substrate;
   a logic cell disposed on the substrate in a peripheral region adjacent the memory cell array; and
   a trench isolation region disposed in the substrate in the peripheral region, the trench isolation region separating a first active area of the logic cell from a second active area of the logic cell,
   wherein the logic cell includes a connection line that is buried within the trench isolation region between the first and second active areas, the connection line corresponding to a signal connection line.

2. The apparatus of claim 1, wherein the buried connection line is an extension of a buried word line formed during a same fabrication process such that the buried connection line linearly aligns with the buried word line.

3. The apparatus of claim 1, wherein the buried connection line includes a metal layer and is connected to a component in at least one of the first active area or the second active area via a local interconnection contact.

4. The apparatus of claim 1, wherein the signal connection line is for transmitting at least one of a data signal, a clock signal, or a command signal to the logic cell, and
   wherein the first active area is a PMOS region and the second active area is a NMOS region.

5. The apparatus of claim 1, further comprising:
a second trench isolation region that separates the logic cell from an adjacent logic cell; and
a second buried connection line disposed within the second trench isolation region,
wherein the second buried connection line is a power connection line connected to a power source.

6. The apparatus of claim 1, wherein the apparatus includes a second trench isolation region in the peripheral region,
wherein the signal connection line is for transmitting at least one of a data signal, a clock signal, or a command signal to the logic cell, and
wherein the second trench isolation region separates the logic cell from an adjacent logic cell and includes a second buried connection line that is a power connection line connected to a power source.

7. The apparatus of claim 1, wherein a cell height of the logic cell is less than a cell height of a standard logic cell that does not include a buried connection line, the standard logic cell having a same number of connection lines as the logic cell.

8. The apparatus of claim 1, wherein a cell height of the logic cell is same as a cell height of a standard logic cell that does not include a buried connection line, and
wherein the logic cell has a greater number of connection lines than the standard logic cell.

9. The apparatus of claim 1, wherein the logic cell corresponds to a standard cell configuration in an automated routing program.

10. The apparatus of claim 1, wherein the trench isolation region is a shallow trench isolation.

11. A method, comprising:
forming a logic cell on a substrate in a periphery region adjacent a memory cell array;
forming a trench isolation region in the substrate in the periphery region, the trench isolation region separating a first active area of the logic cell from a second active area of the logic cell; and
forming a buried connection line within the trench isolation region between the first and second active areas, the buried connection line corresponding to a signal connection line.

12. The method of claim 11, wherein the forming of the buried connection line includes forming a buried word line during a same fabrication process such that the buried word line is an extension of the buried word line.

13. The method of claim 11, further comprising:
forming a local interconnection contact to connect the buried connection line to a component in at least one of the first active area or the second active area.

14. The method of claim 11, wherein the forming the buried connection line includes:
forming a connection line pattern on a photoresist layer on at least one of the substrate or the trench isolation region,
etching to a predetermined depth to create a connection line trench in the at least one of the substrate or the trench isolation region,
depositing a metal in the connection line trench to form a metal layer,
performing a chemical mechanical planarization process on the deposited metal layer, and
depositing a nitride isolation layer on the metal layer.

15. The method of claim 14, wherein the forming the buried connection line further includes depositing a polysilicon layer on the metal layer prior to the deposition of the nitride isolation layer.

16. The method of claim 14, wherein a local interconnection contact to connect the buried connection line to a component in at least one of the first active area or the second active area is created by,
forming a contact pattern on a photoresist layer deposited on the buried connection line,
etching through the nitride isolation layer to create a contact trench at a depth that exposes at least one of the metal layer or a polysilicon layer deposited on the metal layer,
depositing a second metal in the contact trench to form a metal column, and
performing a chemical mechanical planarization process on the deposited metal column.

17. The method of claim 11, further comprising:
etching a segment of the buried connection line that extends into a gap region between the peripheral region and the memory cell array.

18. The method of claim 11, wherein the signal connection line is for transmitting at least one of a data signal, a clock signal, or a command signal to the logic cell, and
wherein the first active area is a PMOS region and the second active area is a NMOS region.

19. The method of claim 11, further comprising:
forming a second trench isolation region that separates the logic cell from an adjacent logic cell; and
forming a second buried connection line, the second buried connection line is a power connection line connected to a power source.

20. The method of claim 11, further comprising:
forming a second trench isolation region in the peripheral region,
wherein the signal connection line is for transmitting at least one of a data signal, a clock signal, or a command signal to the logic cell, and the first active area is a PMOS region and the second active area is a NMOS region,
wherein the second trench isolation region separates the logic cell from an adjacent logic cell and includes a second buried connection line that is a power connection line connected to a power source.

* * * * *